United States Patent
Shih et al.

(10) Patent No.: US 6,436,787 B1
(45) Date of Patent: Aug. 20, 2002

(54) METHOD OF FORMING CROWN-TYPE MIM CAPACITOR INTEGRATED WITH THE CU DAMASCENE PROCESS

(75) Inventors: Wong-Cheng Shih, Kaohsiung; Tzyh-Cheang Lee, Hsin-Chu; Wenchi Ting, Taipei; Chih-Hsien Lin, Hsin-Chu; Shyh-Chyi Wong, Taichung, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/912,735

(22) Filed: Jul. 26, 2001

(51) Int. Cl.[7] .............................................. H01L 21/20
(52) U.S. Cl. ....................... 438/396; 438/253; 438/687
(58) Field of Search ..................... 438/3, 240, 253, 438/255, 296, 398, 687, 642, 643

(56) References Cited

U.S. PATENT DOCUMENTS

| | | | |
|---|---|---|---|
| 5,976,928 A | * 11/1999 | Kirlin et al. | 438/240 |
| 6,025,226 A | 2/2000 | Gambino et al. | 438/244 |
| 6,069,051 A | 5/2000 | Nguyen et al. | 438/396 |
| 6,117,747 A | 9/2000 | Shao et al. | 438/396 |
| 6,150,706 A | * 11/2000 | Thakur et al. | |
| 6,153,510 A | 11/2000 | Ishibashi | 438/622 |
| 6,159,787 A | 12/2000 | Aitken et al. | 438/243 |
| 6,159,793 A | 12/2000 | Lou | 438/255 |
| 6,261,895 B1 | * 7/2001 | Adkisson et al. | 438/240 |
| 6,320,244 B1 | * 11/2001 | Alers et al. | 257/534 |

* cited by examiner

Primary Examiner—Tuan H. Nguyen
(74) Attorney, Agent, or Firm—George O. Saile; Stephen B. Ackerman; Rosemary L. S. Pike

(57) ABSTRACT

A method for fabricating an increased capacitance metal-insulator-metal capacitor using an integrated copper damascene process is described. A contact node is provided overlying a semiconductor substrate. An intermetal dielectric layer is deposited overlying the contact node. A damascene opening is formed through the intermetal dielectric layer to the contact node. A first metal layer is formed on the bottom and sidewalls of the damascene opening and overlying the intermetal dielectric layer. A first barrier metal layer is is deposited overlying the first metal layer. A dielectric layer is dpeosited overlying the first barrier metal layer. A second barrier metal layer is deposited overlying the dielectric layer. A second metal layer is formed overlying the second barrier metal layer and completely filling the damascene opening. The layers are polished back to leave the first metal layer, the dielectric layer, the first and second barrier metal layers, and the second metal layer only within the damascene opening wherein the first metal layer forms a bottom electrode, the dielectric layer forms a capacitor dielectric, and the second metal layer forms a top electrode to complete fabrication of a crown-type capacitor in the fabrication of an integrated circuit device.

29 Claims, 1 Drawing Sheet

METHOD OF FORMING CROWN-TYPE MIM CAPACITOR INTEGRATED WITH THE CU DAMASCENE PROCESS

BACKGROUND OF THE INVENTION (1) Field of the Invention

The present invention relates to methods of fabricating a metal-insulator-metal capacitor, and more particularly, to methods of metal-insulator-metal capacitors integrated with copper damascene processes for mixed signal applications in the fabrication of an integrated circuit device.

(2) Description of the Prior Art

Capacitors are critical components in the integrated circuit devices of today. These passive components are often to be integrated with active bipolar or MOS transistors for analog and digital circuits. Capacitors of the types: polysilicon-insulator-polysilicon (PIP), polysilicon-insulator-polycide, polysilicon-insulator-metal (MIS), and metal-insulator-metal (MIM) capacitors have been used in the art. For mixed signal devices of 0.13 µm and below, copper damascene processes are necessary for high performance. Thus, the capacitor module needs to be integrated with copper metallization. Currently, the copper-integrated capacitor process is only for planar-type capacitors. For a given design rule, or cell size, a crown-shape capacitor provides a much larger effective electrode area than a planar-type capacitor and thus provides much larger capacitance for high-density future generation mixed signal applications. It is desired to provide a method for forming a crown-type MIM capacitor without complicating the existing process.

A number of patents address MIM capacitors. U.S. Pat. No. 6,159,787 to Aitken et al show a metal trench capacitor. U.S. Pat. No. 6,025,226 to Gambino et al discloses a MIM capacitor within a trench. However, leakage current may be a problem in this device. U.S. Pat. No. 6,159,793 to Lou and U.S. Pat. No. 6,069,051 to Nguyen et al disclose MIM capacitors. U.S. Pat. No. 6,117,747 to Shao et al shows a MOM capacitor and a dual damascene process, but the capacitor is not formed completely within a damascene opening.

SUMMARY OF THE INVENTION

Accordingly, it is a primary object of the invention to provide an effective and very manufacturable process for producing a metal-insulator-metal capacitor.

Another object of the present invention is to provide a method for fabricating a metal-insulator-metal capacitor having increased capacitance.

Yet another object of the present invention is to provide a method for fabricating an increased capacitance metal-insulator-metal capacitor using an integrated copper damascene process.

A further object is to provide a method for fabricating an increased capacitance metal-insulator-metal capacitor using an integrated copper damascene process while saving process steps.

In accordance with the objects of this invention, a method for fabricating an increased capacitance metal-insulator-metal capacitor using an integrated copper damascene process is achieved. A contact node is provided overlying a semiconductor substrate. An intermetal dielectric layer is deposited overlying the contact node. A damascene opening is formed through the intermetal dielectric layer to the contact node. A first metal layer is formed on the bottom and sidewalls of the damascene opening and overlying the intermetal dielectric layer. A first barrier metal layer is deposited overlying the first metal layer. A capacitor dielectric layer is deposited overlying the first barrier metal layer. A second barrier metal layer is dpeosited overlying the capacitor dielectric layer. A second metal layer is formed overlying the second barrier metal layer and completely filling the damascene opening. The layers are polished back to leave the first metal layer, the dielectric layer, the first and second barrier metal layers, and the second metal layer only within the damascene opening wherein the first metal layer forms a bottom electrode, the dielectric layer forms a capacitor dielectric, and the second metal layer forms a top electrode to complete fabrication of a crown-type capacitor in the fabrication of an integrated circuit device.

BRIEF DESCRIPTION OF THE DRAWINGS

In the following drawings forming a material part of this description, there is shown.

DESCRIPTION OF THE PREFERRED EMBODIMENTS

The process of the present invention provides a method for fabricating an increased capacitance metal-insulator-metal (MIM) capacitor using an integrated copper damascene process. It is expected that a material other than copper which can be used in the damascene process can also be used in the process of the present invention. The present invention is particularly useful in mixed signal applications, but can be used in any application in which the integration of a damascene process with the MIM capacitor process is desirable.

Figure 1:
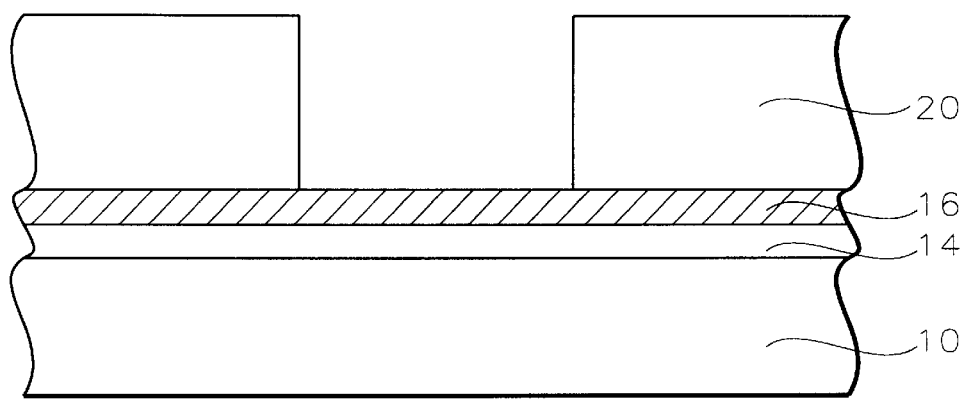
FIGS. 1 through 3 are schematic cross-sectional representations of a preferred embodiment of the present invention.

Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. For example, gate electrodes and associated source and drain regions, not shown, may be fabricated. The semiconductor device structures and an insulating layer formed thereover are represented by 14 in FIG. 1.

Now, a metal line, for example, a copper metal line 16 is formed over the insulating layer and contacting semiconductor device structures within layer 14, not shown, as is conventional. An intermetal dielectric (IMD) layer 20 is deposited over the metal line 16. A damascene opening is etched through the IMD layer 20 to the metal line 16, as is conventional in the art.

In a typical process, the damascene opening would be filled with a metal layer which is polished down to leave the metal only within the opening. Then, a second IMD layer would be deposited, an opening would be etched in the second IMD layer to contact the metal layer. Finally, a capacitor dielectric layer and a second metal layer would be deposited and polished down.

However, the process of the present invention forms a crown-shaped capacitor having an increased capacitance per unit cell by a factor of 1.1 to 10. Furthermore, the process of the present invention saves a masking step and an entire damascene cycle.

Figure 2:
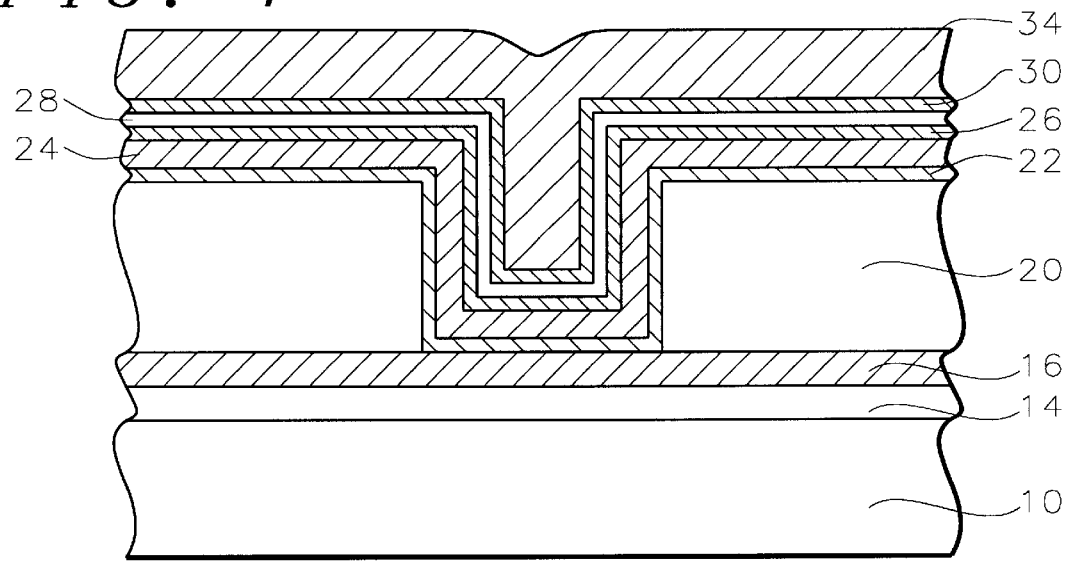

Referring now to FIG. 2, the key features of the present invention will be described. First, a barrier metal layer 22 is deposited conformally within the damascene opening. The barrier metal layer may comprise titanium nitride, tantalum nitride, titanium silicon nitride, or tantalum silicon nitride, for example, and may have a thickness of between about 50 and 500 Angstroms. Now, first copper layer 24 is formed within the damascene opening, for example, by electroplating. The copper is formed to a thickness of between about 500 and 2000 Angstroms on the bottom and sidewalls of the damascene opening as shown in FIG. 2. The copper layer 24 will form the bottom plate of the crown-type capacitor.

Now, a second metal barrier layer 26 is conformally deposited over the copper layer 24. As in the case of the first barrier metal layer, the second barrier metal layer may comprise titanium nitride, tantalum nitride, titanium silicon nitride, or tantalum silicon nitride, for example, and may have a thickness of between about 50 and 500 Angstroms.

Now, a capacitor dielectric layer 28 is conformally deposited over the second barrier metal layer. For example, the capacitor dielectric layer may comprise tantalum oxide or silicon nitride having a thickness of between about 20 and 1000 Angstroms. Other suitable materials include silicon dioxide, $AP_2O_3$, $BaSrTiO_3$, and $SrTiO_3$. Optionally, the dielectric layer may be treated using a rapid thermal process (RTP) in $O_2$, $N_2$, or $N_2O$. Alternatively, a plasma treatment using $O_2$, $N_2$, or $N_2O$ can be performed to densify the dielectric layer.

Next, a third barrier metal layer 30 is conformally deposited over the dielectric layer 28. As in the case of the first and second barrier metal layers, the third barrier metal layer may comprise titanium nitride, tantalum nitride, titanium silicon nitride, or tantalum silicon nitride, for example, and may have a thickness of between about 50 and 500 Angstroms.

Finally, a second copper layer 34 is deposited, such as by electroplating, over the third barrier metal layer, as shown in FIG. 2. The second copper layer deposition is continued until the copper completely fills the damascene opening and overlies the third barrier metal layer outside of the damascene opening.

A key feature of the present invention is the enclosure of the capacitor dielectric layer between two barrier metal layers. These barrier layers prevent copper ions in the layers 24 and 34 from diffusing into the dielectric layer. The barrier layers also prevent oxidation from occurring at the interface between the copper layers and the dielectric layer. Leakage current is greatly reduced by the presence of these enclosing barrier metal layers.

Figure 3:
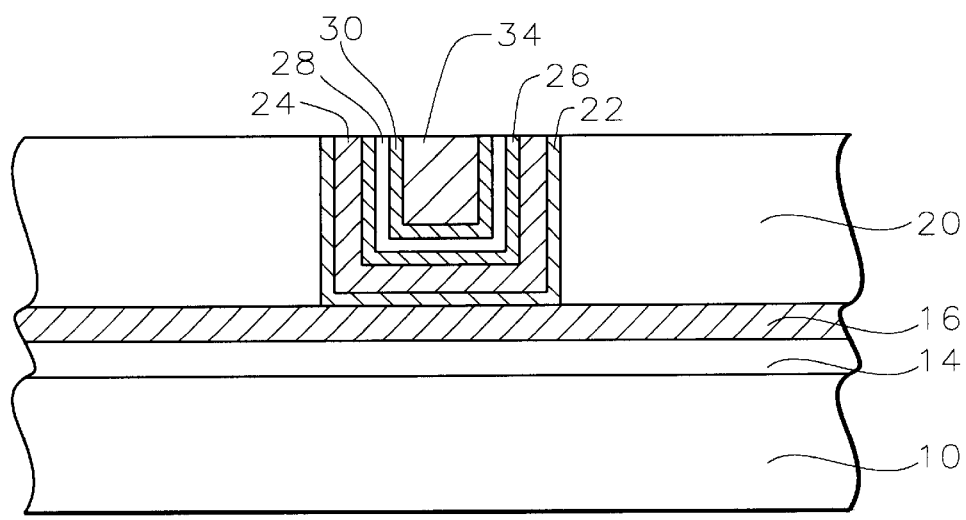

Referring now to FIG. 3, the first and second copper layers, the capacitor dielectric layer, and the three barrier metal layers are all polished down, using for example, chemical mechanical polishing (CMP), until the layers remain only within the damascene opening. This completes formation of the crown-type capacitor of the present invention. The second copper layer forms the top electrode of the capacitor.

The crown-type capacitor of the present invention formed within a damascene opening by a copper damascene process provides a capacitance increase of 1.1 to 10 times that of a typical capacitor not formed within the damascene process of the invention because the effective bottom electrode area is increased by 1.1 to 10 times. The number of masking steps and CMP steps are reduced, saving process time and costs. The copper deposition time for the bottom electrode is reduced because copper is formed only along the bottom and sidewalls of the damascene opening rather than filling the entire opening. This increases throughput.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a crown-type MIM capacitor comprising:

providing a contact node overlying a substrate;

depositing an intermetal dielectric layer overlying said contact node;

forming a damascene opening through said intermetal dielectric layer to said contact node;

forming a first copper layer on the bottom and sidewalls of said damascene opening and overlying said intermetal dielectric layer;

depositing a first barrier metal layer overlying said first copper layer;

depositing a dielectric layer overlying said first barrier metal layer;

depositing a second barrier metal layer overlying said dielectric layer;

forming a second copper layer overlying said second barrier metal layer and completely filling said damascene opening; and polishing back said second copper layer, said second barrier metal layer, said dielectric layer, said first barrier metal layer, and said first copper layer to leave said first copper layer, said second barrier metal layer, said dielectric layer, said first barrier metal layer, and said second copper layer only within said damascene opening wherein said first copper layer forms a bottom electrode, said dielectric layer forms a capacitor dielectric, and said second copper layer forms a top electrode to complete fabrication of said crown-type capacitor in the fabrication of said integrated circuit device.

2. The method according to claim 1 wherein said contact node comprises a metal line overlying an insulating layer formed overlying semiconductor structures in and on said semiconductor substrate.

3. The method according to claim 1 wherein said contact node comprises a copper line.

4. The method according to claim 1 further comprises depositing an initial barrier metal layer within said damascene opening contacting said contact node and underlying said first copper layer.

5. The method according to claim 1 wherein said step of forming said first copper layer comprises electroplating copper.

6. The method according to claim 1 wherein said first copper layer has a thickness of between about 500 and 2000 Angstroms.

7. The method according to claim 1 wherein said first and second barrier metal layers are selected from the group containing TiN, TaN, TiSiN, and TaSiN and have a thickness of between about 50 and 500 Angstroms.

8. The method according to claim 1 wherein said dielectric layer is selected from the group containing: $Ta_2O_5$, SiN, $SiO_2$, $AP_2O_3$, $BaSrTiO_3$, and $SrTiO_3$ and has a thickness of between about 20 and 1000 Angstroms.

9. The method according to claim 1 further comprising treating said dielectric layer using one of the group containing: $O_2$, $N_2$, and $N_2O$ in a process selected from the group containing rapid thermal processing and plasma treatment.

10. The method according to claim 1 wherein said step of forming said second copper layer comprises electroplating copper.

11. The method according to claim 1 wherein said step of polishing back comprises chemical mechanical polishing.

12. A method for fabricating a crown-type MIM capacitor comprising:

providing a copper line overlying an insulating layer on a semiconductor substrate;

depositing an intermetal dielectric layer overlying said copper line;

forming a damascene opening through said intermetal dielectric layer to said copper line;

depositing a first barrier metal layer within said damascene opening and overlying said intermetal dielectric layer;

forming a first copper layer on the bottom and sidewalls of said damascene opening overlying said first barrier metal layer;

depositing a second barrier metal layer overlying said first copper layer;

depositing a dielectric layer overlying said second barrier metal layer;

depositing a third barrier metal layer overlying said dielectric layer;

forming a second copper layer overlying said third barrier metal layer and completely filling said damascene opening; and polishing back said second copper layer, said dielectric layer, said first, second, and third barrier metal layers, and said first copper layer to leave said layers only within said damascene opening wherein said first copper layer forms a bottom electrode, said dielectric layer forms a capacitor dielectric, and said second copper layer forms a top electrode to complete fabrication of said crown-type capacitor in the fabrication of said integrated circuit device.

13. The method according to claim 12 further comprising forming semiconductor device structures in and on said semiconductor substrate wherein said semiconductor device structures are covered by said insulating layer.

14. The method according to claim 12 wherein said step of forming said first copper layer comprises electroplating.

15. The method according to claim 12 wherein said first copper layer has a thickness of between about 500 and 2000 Angstroms.

16. The method according to claim 12 wherein said first, second, and third barrier metal layers are selected from the group containing TiN, TaN, TiSiN, and TaSiN and have a thickness of between about 50 and 500 Angstroms.

17. The method according to claim 12 wherein said dielectric layer is selected from the group containing: $Ta_2O_5$, SiN, $SiO_2$, $AP_2O_3$, $BaSrTiO_3$, and $SrTiO_3$ and has a thickness of between about 20 and 1000 Angstroms.

18. The method according to claim 12 further comprising treating said dielectric layer using one of the group containing: $O_2$, $N_2$, and $N_2O$ in a process selected from the group containing rapid thermal processing and plasma treatment.

19. The method according to claim 12 wherein said step of forming said second metal layer comprises electroplating copper.

20. The method according to claim 12 wherein said step of polishing back comprises chemical mechanical polishing.

21. A method for fabricating a crown-type MIM capacitor comprising:

providing a copper line overlying an insulating layer on a semiconductor substrate;

depositing an intermetal dielectric layer overlying said copper line;

forming a damascene opening through said intermetal dielectric layer to said copper line;

depositing a first barrier metal layer within said damascene opening and overlying said intermetal dielectric layer;

forming a first copper layer on the bottom and sidewalls of said damascene opening overlying said first barrier metal layer;

depositing a second barrier metal layer overlying said first copper layer;

depositing a dielectric layer overlying said second barrier metal layer;

treating said dielectric layer to densify said dielectric layer;

thereafter depositing a third barrier metal layer overlying said dielectric layer;

forming a second copper layer overlying said third barrier metal layer and completely filling said damascene opening; and polishing back said second copper layer, said dielectric layer, said first, second, and third barrier metal layers, and said first copper layer to leave said layers only within said damascene opening wherein said first copper layer forms a bottom electrode, said dielectric layer forms a capacitor dielectric, and said second copper layer forms a top electrode to complete fabrication of said crown-type capacitor in the fabrication of said integrated circuit device.

22. The method according to claim 21 further comprising forming semiconductor device structures in and on said semiconductor substrate wherein said semiconductor device structures are covered by said insulating layer.

23. The method according to claim 21 wherein said step of forming said first copper layer comprises electroplating.

24. The method according to claim 21 wherein said first copper layer has a thickness of between about 500 and 2000 Angstroms.

25. The method according to claim 21 wherein said first, second, and third barrier metal layers are selected from the group containing TiN, TaN, TiSiN, and TaSiN and have a thickness of between about 50 and 500 Angstroms.

26. The method according to claim 21 wherein said dielectric layer is selected from the group containing: $Ta_2O_5$, SiN, $SiO_2$, $AP_2O_3$, $BaSrTiO_3$, and $SrTiO_3$ and has a thickness of between about 20 and 1000 Angstroms.

27. The method according to claim 21 wherein said step of treating said dielectric layer comprises using one of the group containing: $O_2$, $N_2$, and $N_2O$ in a process selected from the group containing rapid thermal processing and plasma treatment.

28. The method according to claim 21 wherein said step of forming said second metal layer comprises electroplating copper.

29. The method according to claim 21 wherein said step of polishing back comprises chemical mechanical polishing.

* * * * *